US012812791B2

(12) United States Patent
Tay et al.

(10) Patent No.: US 12,812,791 B2
(45) Date of Patent: Nov. 24, 2026

(54) PROTECTION STRUCTURE FOR AN APERTURE FOR AN OPTICAL COMPONENT EMBEDDED WITHIN A COMPONENT CARRIER

(71) Applicant: AT&S (China) Co Ltd, Shanghai (CN)

(72) Inventors: Seok Kim Tay, Singapore (SG); Mikael Andreas Tuominen, Pernio (FI)

(73) Assignee: AT&S (China) Co. Ltd., Shanghai (CN)

( * ) Notice: Subject to any disclaimer, the term of this patent is extended or adjusted under 35 U.S.C. 154(b) by 591 days.

(21) Appl. No.: 17/817,843

(22) Filed: Aug. 5, 2022

(65) Prior Publication Data

US 2023/0038270 A1 Feb. 9, 2023

(30) Foreign Application Priority Data

Aug. 6, 2021 (CN) ......................... 202110901352.4

(51) Int. Cl.
*H05K 1/185* (2026.01)
*H10W 70/60* (2026.01)
(Continued)

(52) U.S. Cl.
CPC .......... *H05K 1/188* (2013.01); *H10W 70/614* (2026.01); *H10W 70/685* (2026.01); *H10W 74/114* (2026.01)

(58) Field of Classification Search
CPC ........... H01L 23/3121; H01L 23/49822; H01L 23/5389; H10W 70/614; H10W 74/114;
(Continued)

(56) References Cited

U.S. PATENT DOCUMENTS 6,355,881 B1 3/2002 Braeges et al.
7,790,505 B2 * 9/2010 Lin ...................... H10F 39/804
257/E21.599
(Continued)

FOREIGN PATENT DOCUMENTS

CN 104981101 A 10/2015
CN 206819971 U 12/2017
(Continued)

OTHER PUBLICATIONS

Franssen, G.; Extended European Search Report in Application No. EP 22 18 8680; pp. 1-8; Dec. 22, 2022, European Patent Office, 80298, Munich, Germany.

(Continued)

*Primary Examiner* — Dale E Page
*Assistant Examiner* — Cristian A Tivarus
(74) *Attorney, Agent, or Firm* — Robert A. Blaha; Smith Tempel Blaha LLC

(57) ABSTRACT

A component carrier including (a) a stack having at least one electrically conductive layer structure and at least one electrically insulating layer structure; (b) an optical component embedded within the stack, wherein the optical component comprises an optically active portion; (c) an opening formed within the stack, wherein the optical component and the opening are spatially arranged and configured such that an optical communication between the optically active portion and an exterior of the stack is enabled; and (d) a protection structure extending at least partially around the optically active portion and/or the opening. The protection structure protects the optically active portion from a resin flow during an embedding of the optical component in the stack. A method for manufacturing such a component carrier.

20 Claims, 4 Drawing Sheets

(51) Int. Cl.
*H10W 70/685* (2026.01)
*H10W 74/10* (2026.01)

(58) Field of Classification Search
CPC .............. H10W 70/685; H05K 3/4602; H05K 2201/09909; H05K 1/0274; H05K 2201/10121; H05K 1/188
See application file for complete search history.

(56) References Cited

U.S. PATENT DOCUMENTS

| | | | | |
|---|---|---|---|---|
| 2012/0217607 | A1* | 8/2012 | Hanai | H10F 39/018 438/66 |
| 2016/0211204 | A1* | 7/2016 | Hu | H10W 70/685 |
| 2017/0257532 | A1 | 9/2017 | Takama et al. | |
| 2017/0280027 | A1 | 9/2017 | Wang et al. | |
| 2019/0165019 | A1* | 5/2019 | Wang | H04N 23/54 |
| 2021/0005761 | A1* | 1/2021 | Tsai | H10F 77/93 |
| 2022/0291038 | A1 | 9/2022 | Wang et al. | |

FOREIGN PATENT DOCUMENTS

| | | | | | |
|---|---|---|---|---|---|
| CN | 208691627 | U | | 4/2019 | |
| CN | 110572926 | A | | 12/2019 | |
| CN | 113053325 | A | * | 6/2021 | H05K 3/28 |
| CN | 113207244 | A | | 8/2021 | |
| EP | 1560271 | A2 | | 8/2005 | |
| EP | 2437581 | A1 | | 4/2012 | |
| JP | H09321446 | A | | 12/1997 | |
| JP | 2003109332 | A | | 7/2003 | |
| KR | 20090047319 | A | * | 5/2009 | H05K 1/185 |
| KR | 20100099932 | A | | 9/2010 | |
| KR | 20120130993 | A | | 12/2012 | |
| KR | 101856022 | B1 | * | 5/2018 | H10W 70/09 |

OTHER PUBLICATIONS

English Translation of Office Action in Application No. 202110901352.4; pp. 1-9; Dec. 20, 2025; China National Intellectual Property Administration; No. 6 Xitucheng Road, Haidian District, Beijing, P.R. China, 100088.

Office Action in Application No. 202110901352.4; pp. 1-9; Dec. 20, 2025; China National Intellectual Property Administration; No. 6 Xitucheng Road, Haidian District, Beijing, P.R. China, 100088.

Office Action in Application 202110911352.4; pp. 1-8; Jun. 1, 2026; China National Intellectual Property Administration; No. 6 Xitucheng Road, □Haidian District, Beijing, P.R. China, 100088.

English Translation of Office Action in Application 202110911352.4; pp. 1-8; Jun. 1, 2026; China National Intellectual Property Administration; No. 6 Xitucheng Road, □Haidian District, Beijing, P.R. China, 100088.

* cited by examiner

PROTECTION STRUCTURE FOR AN APERTURE FOR AN OPTICAL COMPONENT EMBEDDED WITHIN A COMPONENT CARRIER

CROSS-REFERENCE TO RELATED APPLICATIONS

This application claims the benefit of the filing date of Chinese Patent Application No. 202110901352.4, filed Aug. 6, 2021, the disclosure of which is hereby incorporated herein by reference.

TECHNICAL FIELD

Embodiments of the present invention relate to a component carrier and a method of manufacturing a component carrier.

BACKGROUND ART

Component carriers onto which electronic assemblies comprising several electronic components are built up are widely used in many electronic consumer devices. In order to increase the integration density of electronic assemblies there have been developed component carriers which, in addition of providing mechanical support and electric connections for electronic components at one or two outer main surfaces, provide some electric functionality by embedding components within a component carrier. Embedded components include, depending on the respective application, active or passive electronic components and optoelectronic or optical components.

In order to allow an embedded optical component to optically communicate with any other optical device being located outside of or exterior from the component carrier it is often necessary to form an aperture within the component carrier which allows the corresponding electromagnetic radiation to propagate though the component carrier.

A component carrier comprises a layer stack with at least one electrically conductive layer structure and at least one electrically insulating layer structure. A component carrier with an embedded electronic component typically comprises in particular several electrically insulating layer structures, which are attached to each other by means of a lamination process, wherein at least partially uncured electrically insulating layer structures, e.g., so called prepreg layer structures, are cured by means of heat and/or pressure. It is obvious that such a lamination process involves the risk that resin material of at least one electrically insulating layer structure penetrates into the region of an aperture, which is necessary for allowing electromagnetic radiation (e.g., optical light) to propagate. Hence, in the final component carrier the optical communication from and/or to the embedded optical component is deteriorated. This reduces the reliability of the optical function of a component carrier with an embedded optical component.

SUMMARY

There may be a need for increasing the optical function of a component carrier, having an embedded optical component.

This need may be met by the subject matter according to the independent claims. Advantageous embodiments of the present invention are described by the dependent claims.

According to a first aspect there is provided a component carrier comprising (a) a stack comprising at least one electrically conductive layer structure and at least one electrically insulating layer structure; (b) an optical component embedded within the stack, wherein the optical component comprises an optically active portion; (c) an opening formed within the stack, wherein the optical component and the opening are spatially arranged and configured such that an optical communication between the optically active portion and an exterior of the stack is enabled; and (d) a protection structure extending at least partially around the optically active portion and/or the opening, wherein the protection structure is configured for protecting the optically active portion from a resin flow (of an encapsulating material) during an embedding of the optical component in the stack.

According to a further aspect there is provided a method for manufacturing a component carrier. The provided method comprises (a) providing a stack comprising at least one electrically conductive layer structure and at least one electrically insulating layer structure; (b) providing an optical component having an optically active portion; (c) forming a protection structure at (a main surface of) the optical component, wherein the protection structure surrounds at least partially the optically active portion; and (d) embedding the optical component within the stack, wherein the optically active portion is protected from a resin flow (of an encapsulating material) by means of the protection structure.

OVERVIEW OF EMBODIMENTS

The described component carrier is based on the idea that by protecting the region of the component carrier, which region is associated with the propagation of the electromagnetic radiation which, during operation, is transmitted by the optically active portion of the optical component and/or is received from the optically active portion, a high reliability and a high sensitivity of the optical functionality of the described component carrier can be guaranteed. Specifically, the described protection structure allows to manufacture and/or further process the component carrier for instance with resin-based materials which, when being applied in particular during a (heat and/or pressure assisted) lamination procedure, are prevented from penetrating into the opening region and/or onto the optically active portion. Hence, the optically active portion will remain free from material which potentially could block or at least attenuate the electromagnetic radiation propagating being transmitted or received by the optically active portion.

A reliable protection from unwanted material may allow to use also materials for further processing the component carrier which materials are, due to their chemical and/or physical nature, not (directly) suitable for known and well-established encapsulation and/or other printed circuit board (PCB) processing and/or manufacturing processes.

In the context of this document, the term "optical active portion" refers to a spatial region of a body of the optical component which spatial region is responsible for emitting and/or for receiving the electromagnetic radiation. Of course, the optical component must also comprise an electric active portion in order to connect the optical component with external electric circuitry. This external circuitry may be formed within, at or external from the described component carrier.

The described optical communication may be associated with the transmission of electromagnetic waves of at least one wavelength. In this context the term optical has to be understood in a broad manner. It should not be understood as to be limited to optical signals, which are visible for the human eye. Rather, depending on the specific application also not available electromagnetic radiation can be used, for instance in the infrared (IR) spectral regime.

The stack may comprise a core, which in the context of Printed Circuit Board (PCB) technology may be a dielectric layer which has undergone already a certain curing resulting in an increased mechanical stability or rigidity.

In the context of this document, the term “component carrier” may particularly denote any support structure, which is capable of accommodating one or more components thereon and/or therein for providing mechanical support and/or electrical connectivity. In other words, a component carrier may be configured as a mechanical and/or electronic carrier for components. In particular, a component carrier may be one of a printed circuit board, an organic interposer, and an IC (integrated circuit) substrate. A component carrier may also be a hybrid board combining different ones of the above-mentioned types of component carriers.

The component carrier may be a laminate of the described electrically insulating layer structure(s) and electrically conductive layer structure(s), in particular formed by applying mechanical pressure and/or thermal energy. The described stack may provide a plate-shaped component carrier capable of providing a large mounting surface for further components and being nevertheless very thin and compact. The term “layer structure” may particularly denote a continuous layer, a patterned layer or a plurality of non-consecutive islands within a common plane.

In an embodiment, the component carrier is shaped as a plate. This contributes to the compact design, wherein the component carrier nevertheless provides, in addition to the space being occupied by the embedded (optical) component, a large basis for mounting components thereon.

The described optical component may be a naked die which can be conveniently embedded, thanks to its small thickness, into a thin plate such as a printed circuit board (PCB).

The component carrier may be configured as one of the group consisting of a PCB, a substrate, in particular an IC substrate, and an interposer.

In the context of this document, the term “printed circuit board” (PCB) may particularly denote a plate-shaped component carrier which is formed by laminating several electrically conductive layer structures with several electrically insulating layer structures, for instance by applying pressure and/or by the supply of thermal energy. As preferred materials for PCB technology, the electrically conductive layer structures are made of copper, whereas the electrically insulating layer structures may comprise resin and/or glass fibers, so-called prepreg or FR4 material. The various electrically conductive layer structures may be connected to one another in a desired way by forming through-holes through the laminate, for instance by laser drilling or mechanical drilling, and by filling them with electrically conductive material (in particular copper), thereby forming vias as through-hole connections. Apart from one or more components which may be embedded in a printed circuit board, a printed circuit board is usually configured for accommodating one or more components on one or both opposing surfaces of the plate-shaped printed circuit board. They may be connected to the respective main surface by soldering. A dielectric part of a PCB may be composed of resin with reinforcing fibers (such as glass fibers).

In the context this document, the term “substrate” may particularly denote a small component carrier. A substrate may be a, in relation to a PCB, comparably small component carrier onto which one or more components may be mounted and that may act as a connection medium between one or more chip(s) and a further PCB. For instance, a substrate may have substantially the same size as a component (in particular an electronic component) to be mounted thereon (for instance in case of a Chip Size Package (CSP)). More specifically, a substrate can be understood as a carrier for electrical connections or electrical networks as well as component carrier comparable to a printed circuit board (PCB), however with a considerably higher density of laterally and/or vertically arranged connections. Lateral connections are for example conductive paths, whereas vertical connections may be for example drill holes. These lateral and/or vertical connections are arranged within the substrate and can be used to provide electrical, thermal and/or mechanical connections of housed components or unhoused components (such as bare dies), particularly of IC chips, with a printed circuit board or intermediate printed circuit board. Thus, the term “substrate” also includes “IC substrates”. A dielectric part of a substrate may be composed of resin with reinforcing particles (such as reinforcing spheres, in particular glass spheres). A substrate or interposer may comprise or consist of at least a layer of glass, silicon (Si) or a photoimageable or dry-etchable organic material like epoxy-based build-up material (such as epoxy-based build-up film) or polymer compounds like polyimide, polybenzoxazole, or benzocyclobutene-functionalized polymers.

In some embodiments, the at least one electrically insulating layer structure comprises at least one of the group consisting of resin (such as reinforced or non-reinforced resins, for instance epoxy resin or bismaleimide-triazine resin), cyanate ester resin, polyphenylene derivate, glass (in particular glass fibers, multi-layer glass, glass-like materials), prepreg material (such as FR-4 or FR-5), polyimide, polyamide, liquid crystal polymer (LCP), epoxy-based build-up film, polytetrafluoroethylene (PTFE, Teflon®), a ceramic, and a metal oxide. Teflon® is a registered mark of The Chemours Company FC LLC of Wilmington, Delaware, U.S.A. Reinforcing structures such as webs, fibers or spheres, for example made of glass (multilayer glass) may be used as well. Although prepreg particularly FR4 are usually preferred for rigid PCBs, other materials in particular epoxy-based build-up film or photoimageable dielectric material may be used as well. For high frequency applications, high-frequency materials such as polytetrafluoroethylene, liquid crystal polymer and/or cyanate ester resins, low temperature cofired ceramics (LTCC) or other low, very low or ultra-low DK materials may be implemented in the component carrier as electrically insulating layer structure.

In some embodiments, the at least one electrically conductive layer structure comprises at least one of the group consisting of copper, aluminum, nickel, silver, gold, palladium, and tungsten. Although copper is usually preferred, other materials or coated versions thereof are possible as well, in particular coated with supra-conductive material such as graphene.

The optical component can be selected from a group consisting of an optoelectronic interface element, a light emitting diode, a photocoupler, an optical transmitter and/or receiver, an optical sensor, a camera, a light guiding element (for example an optical waveguide or a light conductor connection), an optical element (for instance a lens), etc. Of course, also more than one optical component can be embedded within the described component carrier.

It is pointed out that of course every one of these optical components must have an optical active portion for emitting and/or for receiving electromagnetic radiation and also an electric portion in order to connect the optical component with electric circuitry being external to the respective optical component.

In addition to the (at least one) optical component also at least one other component may be embedded. The other component can be selected from a group consisting of an electrically non-conductive inlay, an electrically conductive inlay (such as a metal inlay, preferably comprising copper or aluminum), a heat transfer unit (for example a heat pipe), an electronic component, or combinations thereof. For example, the other component can be an active electronic component, a passive electronic component, an electronic chip, a storage device (for instance a DRAM or another data memory), a filter, an integrated circuit, a signal processing component, a power management component, a voltage converter (for example a DC/DC converter or an AC/DC converter), a cryptographic component, an electromechanical transducer, a sensor, an actuator, a microelectromechanical system (MEMS), a microprocessor, a capacitor, a resistor, an inductance, a battery, a switch, an antenna, a logic chip, and an energy harvesting unit. However, other components may be embedded in the component carrier. For example, a magnetic element can be used as a component. Such a magnetic element may be a permanent magnetic element (such as a ferromagnetic element, an antiferromagnetic element, a multiferroic element or a ferrimagnetic element, for instance a ferrite core) or may be a paramagnetic element. However, the component may also be a substrate, an interposer or a further component carrier, for example in a board-in-board configuration. The other component may be surface mounted at the component carrier and/or may be embedded in an interior thereof.

After processing interior layer structures of the component carrier, it is possible to cover (in particular by lamination) one or both opposing main surfaces of the processed layer structures symmetrically or asymmetrically with one or more further electrically insulating layer structures and/or electrically conductive layer structures. In other words, a build-up may be continued until a desired number of layers is obtained.

After having completed formation of a stack of electrically insulating layer structures and electrically conductive layer structures, it is possible to proceed with a surface treatment of the obtained layers structures or component carrier. In particular, an electrically insulating solder resist may be applied to one or both opposing main surfaces of the layer stack or component carrier in terms of surface treatment. For instance, it is possible to form such as solder resist on an entire main surface and to subsequently pattern the layer of solder resist so as to expose one or more electrically conductive surface portions which shall be used for electrically coupling the component carrier to an electronic periphery. The surface portions of the component carrier remaining covered with solder resist may be efficiently protected against oxidation or corrosion, in particular surface portions containing copper.

It is also possible to apply a surface finish selectively to exposed electrically conductive surface portions of the component carrier in terms of surface treatment. Such a surface finish may be an electrically conductive cover material on exposed electrically conductive layer structures (such as pads, conductive tracks, etc., in particular comprising or consisting of copper) on a surface of a component carrier. If such exposed electrically conductive layer structures are left unprotected, then the exposed electrically conductive component carrier material (in particular copper) might oxidize, making the component carrier less reliable. A surface finish may then be formed for instance as an interface between a surface mounted component and the component carrier. The surface finish has the function to protect the exposed electrically conductive layer structures (in particular copper circuitry) and enable a joining process with one or more components, for instance by soldering. Examples for appropriate materials for a surface finish are Organic Solderability Preservative (OSP), Electroless Nickel Immersion Gold (ENIG), gold (in particular Hard Gold), chemical tin, nickel-gold, nickel-palladium, ENIPIG (Electroless Nickel Immersion Palladium Immersion Gold, etc.

According to an embodiment the optical component is embedded within an interior of the stack; and the opening is an aperture formed by at least one electrically conductive layer structure and/or at least one electrically insulating layer structure of the stack. This may provide the advantage that the optical component is widely protected from external impacts respectively environmental effect which could potentially damage the optical component or compromise the operation of the optical component. The only direct physical contact of the optical component to the "outside world" may be through the aperture which could be very narrow in order to reduce the external impacts to a minimum.

According to a further embodiment the opening is a cavity accommodating the optical component. This may provide the advantage that the described component carrier can be realized in a simple and effective manner. It is in particular not necessary to embed the component and to form at least one further stack layer above the component in order to provide a spatially narrowing aperture, which only or predominately "opens" the optically active portion to the "outside world".

According to a further embodiment the protection structure extends to the full extent around the optically active portion and/or the opening. This means that the protection of the aperture region may be effective to prevent unwanted material intrusion from all sides. Hence, a particular high reliability of keeping the optically active portion free from any unwanted material can be achieved.

According to a further embodiment the protection structure extends circumferentially around the optically active portion and/or the opening. This can be realized with an annular, circular or any rounded shape of the protection structure.

According to a further embodiment the protection structure extends in a rectangular manner around the optically active portion and/or the opening. This may allow to adapt the shape of the protection structure to a potential rectangular shape of the optically active portion and/or the aperture.

According to a further embodiment the protection structure is a part of or is directly attached to the optical component. This may provide the advantage that a manufacturing or (further) processing of the component carrier will be simplified. Specifically, in some embodiments with an opening representing an aperture the protective structure may define a protected region even if the aperture has not yet been formed because it will be provided within a layer, in particular a dielectric/resin layer, which, in the final component carrier, is in direct contact with the optical component, however in surface regions being different from the aperture region.

In some applications the protection structure is formed at the main body of the optical component before it is embedded into the layer stack of the component carrier. In other applications the protection structure is formed (immediately) after the optical component has been embedded. However, according to all variants of this embodiment the protection structure is formed before a (dielectric) layer is formed, which covers and/or protects the optical component in the final product.

According to a further embodiment the protection structure protrudes from an outer main surface of the optical component. This may provide the advantage that a reliable protection of the opening region can be realized in a simple and effective manner. Further, by choosing an appropriate height of the protection structure the "strength" of the barrier preventing material from being penetrated onto the optically active portion and/or into the aperture region, can be adjusted easily.

In the context of this document the term (outer) main surface may denominate one of the two surfaces of the optical component which surfaces are oriented parallel to the layers of the stack or, more precisely, parallel to the interface plane between two neighboring layers of the stack.

According to a further embodiment the protection structure protrudes from the outer main surface of the optical component by a first protrusion length and sidewalls of the opening protrude from the outer main surface of the optical component by a second protrusion length. Thereby, the first protrusion length is larger than the second protrusion length.

According to a further embodiment the optical component comprises a redistribution layer structure, wherein the protection structure forms a part of the redistribution layer structure. This may provide the advantage that the protection structure can be formed with other structures of the optical component, which other structures are necessary anyway for allowing to electrically contact the optical component (in the final product) in a reliable manner.

In the context of this document a redistribution layer (RDL) is an extra metal layer within the component carrier and/or of the optical component that makes the electrical connection pads of the optical component and, optionally also of other embedded components, available in other locations of the component. Thereby, where necessary, a better access to the electrical connection pads of the optical component can be provided. In other words, a RDL is an extra layer of wiring on or at the (optical) component that enables connecting/bonding the electrical connection pads out from different locations on the optical component. Thereby, the electric contact points around or at the component can be spatially spread apart such that electrically contacting the (optical) components will be facilitated.

According to a further embodiment the protection structure is a protrusion protruding from an outer (main) surface of the stack. This may be of benefit for a final component carrier product, where a further layer is provided/formed at the outer (main) surface of an extended stack comprising the (before mentioned) stack. This means that in this case the outer (main) surface of the stack is an inner surface/interface of the extended stack. Thereby, this interface is defined by the boundary between the stack and the further layer.

According to a further embodiment the protection structure is a recess extending into a main surface of the stack.

Realizing the protection structure by means of a recess may provide the advantage that the protection structure can be formed in a simple but effective manner by means of a "subtractive processing". This means that material is selectively removed from a layer (of the stack) such that a trench is formed. This trench will then act as a flow barrier for material of a further (dielectric) layer on top, which further layer is, e.g., during a lamination process, (still) in an at least partially liquid state.

According to a further embodiment the protection structure is made of metal and/or an electrically insulating material. The electrically insulating material may be a plastic material.

Depending on the specific application the protection structure can be made from or can comprise any suitable material. Specifically, cohesion and/or adhesion properties can be taken into account when selecting a suitable material for the protection structure.

According to a further embodiment the protection structure comprises a thickness being the same or being larger than the thickness of a layer of a material encapsulating at least partially the embedded optical component.

According to a further embodiment the aperture is uncovered.

Keeping the aperture (structure) empty may provide the advantage that the electromagnetic radiation signals propagating through the aperture do not suffer from any additional attenuation. As a consequence, a high sensitivity of the described component carrier with regard to the transmission and/or reception of optic signals can be achieved.

According to a further embodiment the aperture is at least partially filled with an optically transparent medium.

Protecting, after the component carrier has been manufactured, the aperture with an optically transparent medium may provide the advantage that also during operation of the described component carrier, no material can enter the aperture region. This means that it is not possible that electromagnetic signals propagating through the aperture suffer from (additional) attenuation.

The optically transparent medium could be selected from a standard dielectric material being typically used for a component encapsulation. Thereby, no special optical parameters should be provided at the top side and at side walls of this medium filled at least partially within the aperture.

According to a further embodiment a transmittance value of the optically transparent medium is larger than 80%, preferably larger than 90%.

According to a further embodiment the transmittance value applies for a wavelength range between 250 nm and 1250 nm and in particular for a wavelength range between 300 nm and 1000 nm.

According to a further embodiment the optically transparent medium is formed exclusively within the aperture and optionally within an annular surrounding thereof. This may provide the advantage that the optically transparent medium is only formed at locations/regions of the component carrier which may be spatially associated with the propagation of the optical communication signals.

According to a further embodiment the optically transparent medium is formed at an entire main surface of the stack.

Forming respectively applying the optically transparent medium on or at the entire main surface of the stack may provide the advantage that corresponding formation/application process can be carried out in a simple manner. Specifically, no spatial or conformal mask will be needed. Further, in case the optically transparent medium exhibits, in addition to its optical properties, also the property of a mechanical protection, the entire component carrier will be mechanically protected in a simple and effective manner.

According to a further embodiment the optical component is embedded in a core, wherein a buildup comprising a resin layer is formed on the core. This may provide the advantage that the optical component can be embedded in a safe and reliable manner. This is because a core can be seen as mechanically stable support or frame structure which allows the component to be accommodated in a stable environment. This may be of advantage in particular for the described optical component because any spatial shift of the optical component within the stack, for instance caused by temperature variations and/or external pressure, may cause an optical misalignment between the optically active portion and at least one other/external optical component such as a light receiver (e. g. a photodiode, a camera, etc.), a light transmitter (e.g., a light emitting diode), a lens, a prism, a front surface of an optical waveguide, etc.

It is pointed out that the above-described aperture may be formed at least partially within the resin layer. Optionally at least one further layer is formed directly or indirectly at the core or at the described resin layer.

According to a further embodiment the optical component is one of (a) an optical receiver, in particular a sensor, a photodiode or a camera; (b) an optical transmitter, in particular a light emitting diode or a laser diode; and (c) an optical transceiver, in particular and optical communication module. This may provide the advantage that the described component carrier can be employed for a wide range of optical communication applications.

Also, the described method is based on the idea that by protecting the region of the component carrier, which is associated with the propagation of the electromagnetic radiation, from unwanted material intrusions, a high reliability and a high sensitivity of the optical functionality of the resulting component carrier can be guaranteed.

According to an embodiment an opening is formed within the stack, wherein the optical component and the opening are spatially arranged and configured such that an optical communication between the optically active portion and an exterior of the stack is enabled.

As has already been mentioned above, the optical component may be embedded within an interior of the stack and the opening may be an aperture formed by at least one electrically conductive layer structure and/or at least one electrically insulating layer structure of the stack. Alternatively, the opening may be a cavity for accommodating the optical component. In the latter case the outer surface of the optical component may be aligned with an outer surface of the stack.

According to a further embodiment forming the aperture comprises (a) temporally filling an opening region in the stack with a poorly adhesive material, and (b) removing the poorly adhesive material after having completed the embedding of the optical component within the stack. This may provide the advantage that, apart from and in addition to the described protection structure, the opening region can be kept clean from an unwanted infiltration of material which may attenuate electromagnetic signals propagating from or to the optically active portion.

It has to be noted that embodiments of the subject technology have been described with reference to different subject matters. In particular, some embodiments have been described with reference to method type claims whereas other embodiments have been described with reference to apparatus type claims. However, a person skilled in the art will gather from the above and the following description that, unless other notified, in addition to any combination of features belonging to one type of subject matter also any combination between features relating to different subject matters, in particular between features of the method type claims and features of the apparatus type claims is considered as to be disclosed with this document.

The aspects defined above and further aspects are apparent from the examples of embodiment to be described hereinafter and are explained with reference to the examples of embodiment. The invention will be described in more detail hereinafter with reference to examples of embodiment but to which the invention is not limited.

DETAILED DESCRIPTION OF ILLUSTRATED EMBODIMENTS

Figure 1A:
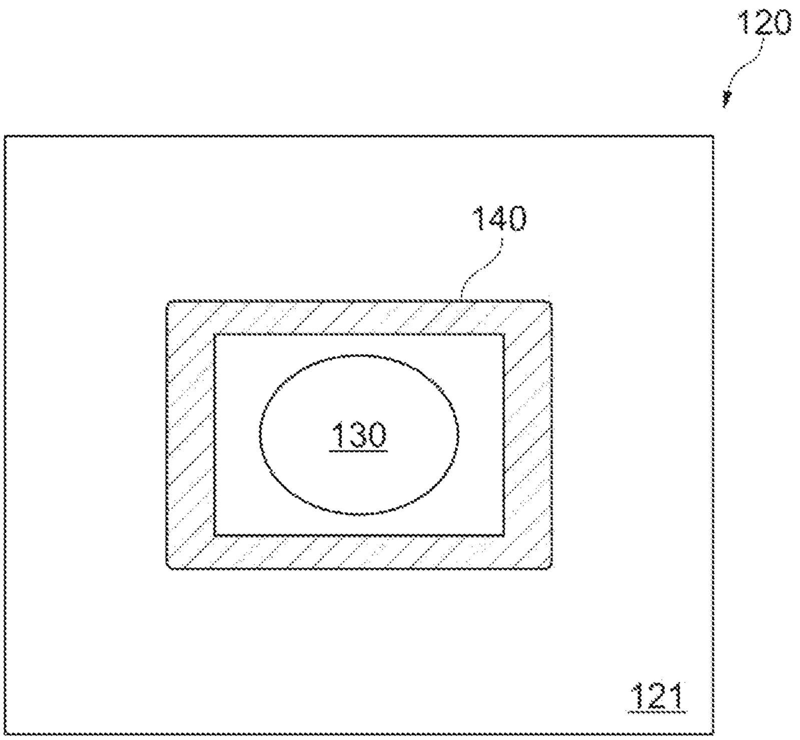
FIG. 1A and FIG. 1B show an optical component having a resin flow protection structure formed at an outer main surface of a body of the optical component.

The illustrations in the drawings are schematically presented. It is noted that in different figures, similar or identical elements or features are provided with the same reference signs or with reference signs, which are different from the corresponding reference signs only within the first digit. In order to avoid unnecessary repetitions, elements or features, which have already been elucidated with respect to a previously described embodiment, are not elucidated again at a later position of the description.

Further, spatially relative terms, such as “front” and “back”, “above” and “below”, “left” and “right”, et cetera are used to describe an element’s relationship to another element(s) as illustrated in the Figures. Thus, the spatially relative terms may apply to orientations in use which differ from the orientation depicted in the Figures. Obviously all such spatially relative terms refer to the orientation shown in the Figures only for ease of description and are not necessarily limiting as an apparatus according to an embodiment can assume orientations different than those illustrated in the Figures when in use.

Before, referring to the drawings, exemplary embodiments will be described in further detail, some basic considerations will be summarized based on which exemplary embodiments of the invention have been developed.

Embodiments of the invention relate to a specific feature provided at a surface of an optical component which is (supposed to be) embedded within a stack of a component carrier such as a Printed Circuit Board (PCB). This specific feature is a protection structure which enables a safe and robust embedded packaging process of the optical component. The specific protection structure may be at least a part of a redistribution layer (RDL), which is provided at the body of the optical component. The protection structure is configured for ensuring that an encapsulation resin will not flow and contaminate an optical aperture region which enables an optical communication between (an optically active portion of) the optical component and an exterior of the stack respectively the component carrier. The protection structure may, due to its flow protection function, denominated a (resin) flow guard structure. The protection structure/flow guard structure may have height (along a z-direction) such that it represents the "highest point" (of a RDL) above the respective surface of the optical component in order to ensure a full sealing of the aperture region from unwanted resin flow. Thereby, the z-direction is perpendicular to the interfaces between neighboring layers of the component carrier stack.

Figure 1B:
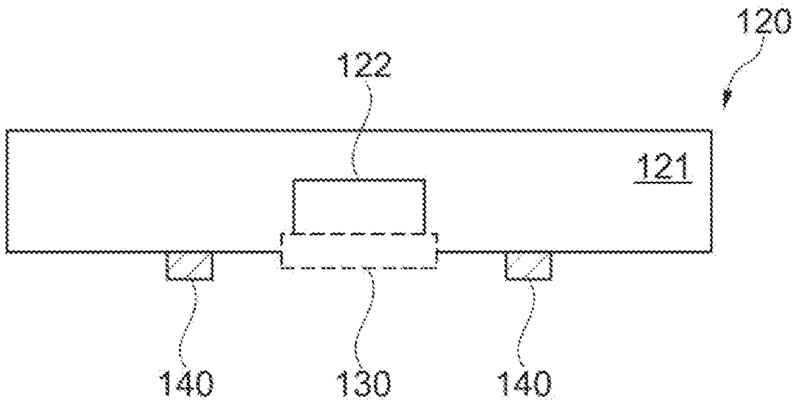

FIG. 1A and FIG. 1B show an optical component 120, which is prepared for being embedded within a non-depicted stack of a component carrier. FIG. 1A is a top view and FIG. 1B is a cross-sectional view of the optical component 120.

The optical component 120 comprises a body portion 121 and an optical active portion 122. The optical active portion 122 may be at least one of an optoelectronic emitter, e.g., a light emitting diode (LED), and an optoelectronic receiver, e.g., a photodiode (PD). An aperture region 130, which is used by the optical component 120 for transmitting and/or receiving electromagnetic radiation, it is denominated with reference number 130. In order to protect the aperture 130 from an unwanted resin flow during an embedding process, there is provided a protection structure 140, which is configured for blocking such a resin flow into the aperture region 130. The protection structure 140 is elevated from the (lower) main surface of the optical component 120 (see FIG. 1B). It should be understood that such a resin flow could result in resin material which could block or at least attenuate of the electromagnetic radiation propagating through the aperture 130.

The protection structure 140 may be made of any material which allows for stopping a flow of (at least partially liquid) resin material. Thereby, the resin material may originate from a known encapsulating material which is used for the embedding process. Depending on the specific application the protection structure 140 may be made of metal and/or an electrically insulating material, in particular a plastic material.

As has already been mentioned above, the protection structure 140 may be at least a part of a RDL, which may be formed anyway at the respective outer main surface of the optical component 120.

Figure 2:
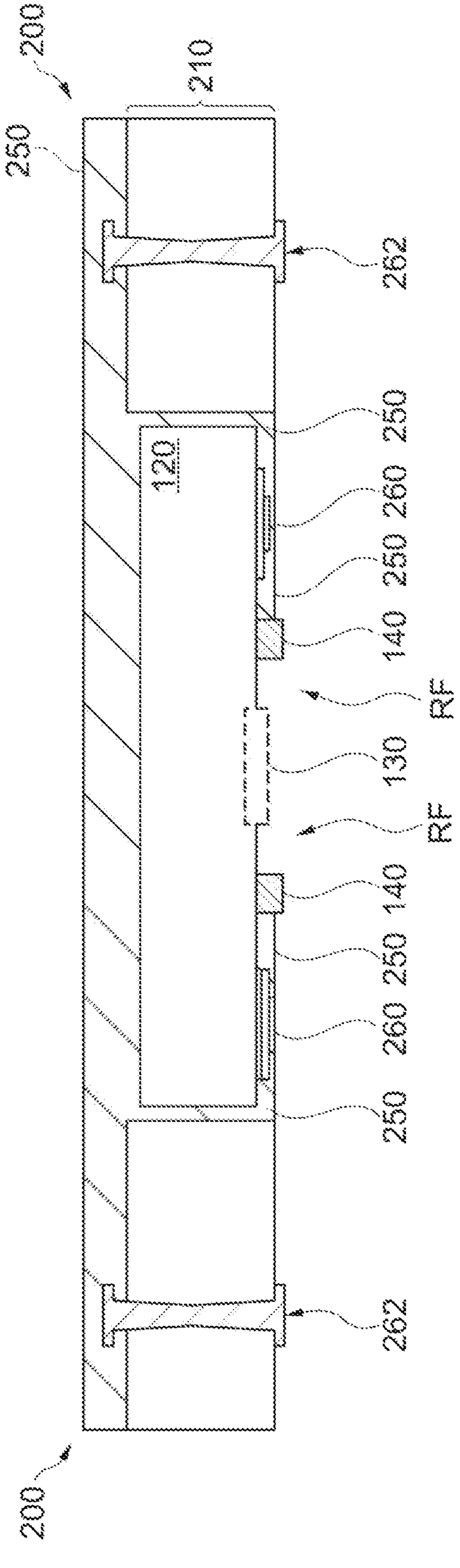
FIG. 2 shows the optical component after having been embedded into a stack or a core of a component carrier.

FIG. 2 shows the optical component 120 after having been embedded into a stack 210 of a component carrier 200. According to the exemplary embodiment described here the stack is or comprises a core 210 of the component carrier 200. The core 210 may be made from a dielectric material which has already undergone an at least partial curing process resulting in comparatively large mechanical stability of the core 210.

A known encapsulating material 250 is used for mounting or attaching the optical component 120 within a cavity formed within the core 120. The encapsulating material 250 comprises a resin. The encapsulation/embedding process of the optical component 120 typically comprises a heat and/or pressure assisted lamination process, during which the encapsulating material 250 is or becomes at least partially liquid. The protection structure 140, which is depicted already in FIGS. 1A and 1B, prevents (liquid) resin material (of the encapsulating material 250) from entering into the aperture region 130. Hence, within the protection structure 140 there is provided a resin free region RF. The aperture region 130 is located within this resin free region RF.

According to the embodiment described here the optical component 120 comprises two electric connection structures 260, which are formed at the bottom main surface of the optical component 120. The electric connection structures 260 are used for electrically connecting the optical component 120 with other external or internal circuitry.

Spaced apart from the optical component 120 there are formed two vias 262, one in FIG. 2 at the left side of the optical component 120 and the other one at the right side of the optical component 120.

Figure 3:
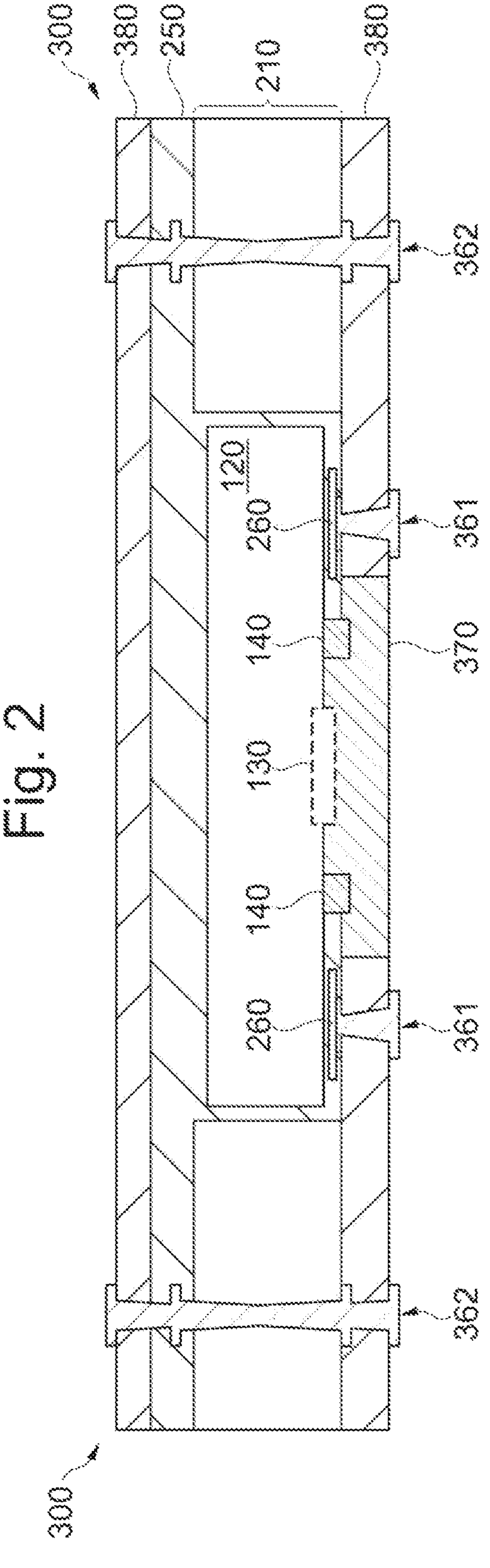
FIG. 3 shows a component carrier with an embedded optical component and an optically transparent medium being locally applied in and around an aperture region.

FIG. 3 shows the component carrier 200, which is now denominated with reference numeral 300, after at least one further processing step. As can be taken from this Figure, an optically transparent medium 370 has been locally applied in and around the aperture region 130. This optically transparent medium 370 provides a protection of the aperture 130 from being polluted with foreign particles such as, e.g., dust. Hence, the optically transparent medium 370 ensures a long lasting and low attenuation optical communication through the aperture 130.

Further, as can also be taken from FIG. 3, the component carrier 300 comprises two upper buildup layer structures 380. An upper one of the two buildup layer structures 380 covers the entire upper main surface of the component carrier 300. The lower one of the two buildup layer structures 380 surrounds the locally applied optically transparent medium 370. It is pointed out that when manufacturing the component carrier 300 the lower buildup layer structure 380 may also be formed prior to the optically transparent medium 370. In this case, within the lower buildup layer structure 380, there would be formed a recess and the optically transparent medium 370 would be formed selectively within this recess.

According to the exemplary embodiment described here the connection structures 260 of the optical component 120 are electrically contacted with respectively one via connection structure 361 extending through the lower buildup layer structure 380. Further, the vias 262 are extended such that two extended via structures 362 are formed which also extend through the lower buildup layer structure 380.

Figure 4:
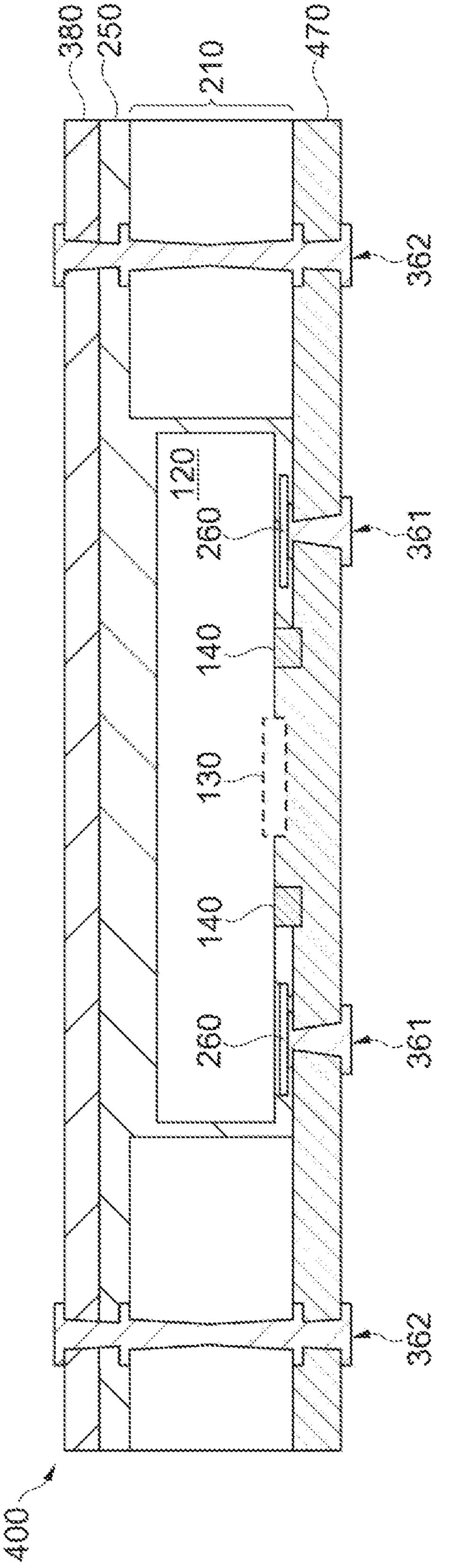
FIG. 4 shows a component carrier with an embedded optical component and an optically transparent medium being entirely applied at a main surface of the component carrier.

FIG. 4 shows a component carrier 400 in accordance with a further embodiment. The component carrier 400 basically corresponds to the component carrier 300 shown in FIG. 3. The only difference is that, instead of the (recessed) lower buildup layer structure 380, there is used a complete layer of optically transparent medium 470. This complete layer of optically transparent medium 470 covers the entire lower main surface of the core 210.

Figure 5:
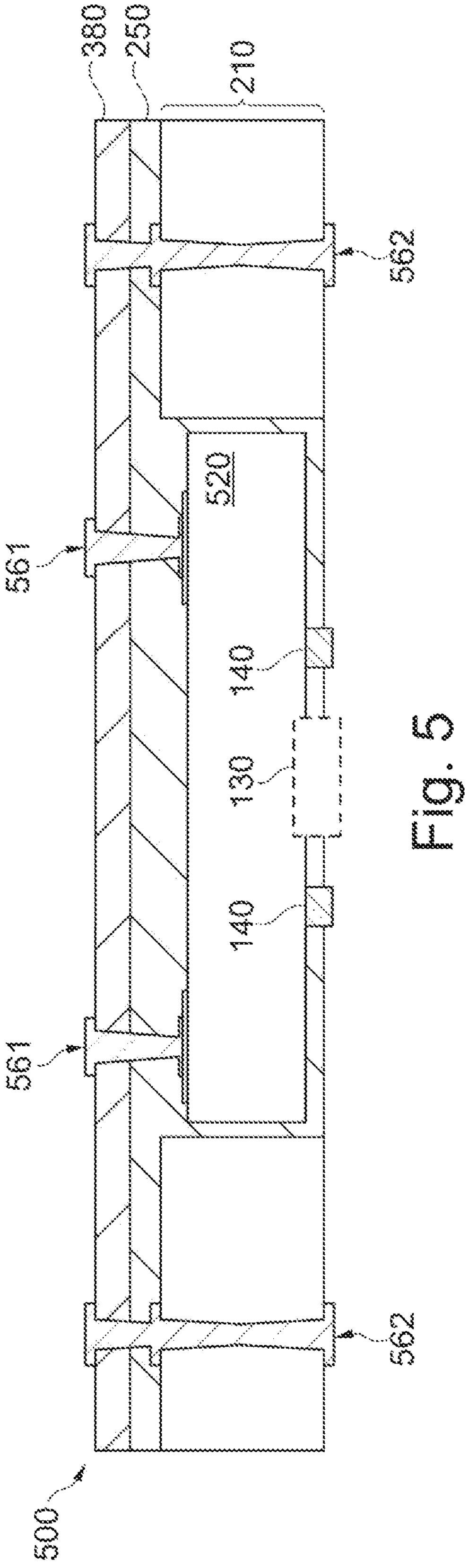
FIG. 5 shows a component carrier with an embedded optical component and an avoid aperture region.

FIG. 5 shows a component carrier 500 in accordance with a further embodiment. The component carrier 500 comprises an embedded optical component 520, which, by contrast to the optical component 120, is electrically contacted from the upper side. As a consequence, via connection structures 561 are provided, which extend through the upper buildup layer structure 380.

Further, as can be taken from FIG. 5 and by contrast to the component carriers 300 and 400, there is not used any protection for the aperture region 130. Hence, below the core 210 (and the encapsulated component 520) there it is not provided any further layer. Hence, the (extended) vias 562 only extend through (i) the core 210, (ii) the encapsulating material 250 formed above the core 210, and (iii) the upper buildup layer structure 380.

Figure 6:
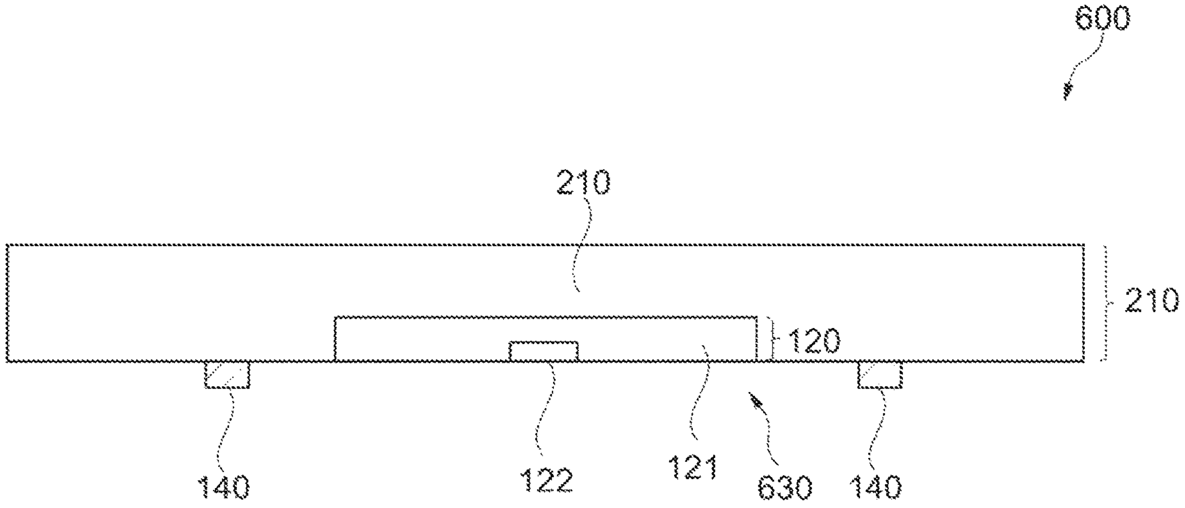
FIG. 6 shows a component carrier with an optical component being embedded within an opening, wherein an outer surface of the component is aligned with an outer surface of the stack.

FIG. 6 shows a component carrier 600 according to a further embodiment. In this embodiment the optical component 120 is embedded within a cavity 630. The cavity 630 is dimensioned such that the component 120, if applicable with not depicted gap filling material, geometrically fits to the cavity 630. Hence, an outer surface of the component 120 is aligned with an outer surface of the stack 210 of the component carrier 600.

As can be taken from FIG. 6, the protection structure 140 is formed at the lower surface of the stack 210 and defines a protected region. Further, the entire component 120 is located within this protected region.

As can be further taken from FIG. 6, the outer surface of the optically active portion 122 is also aligned with the outer surface of the stack 210. Hence, there is not provided and also not needed an aperture at least within any outer layer of the stack 210 as it is depicted here. However, it should be clear that this does not hold true for a component carrier which in addition to the stack 210 comprises further build-up layers at its bottom side.

It should be noted that the term "comprising" does not exclude other elements or steps and the use of articles "a" or "an" does not exclude a plurality. Also, elements described in association with different embodiments may be combined.

Implementation of the invention is not limited to the preferred embodiments shown in the figures and described above. Instead, a multiplicity of variants is possible which variants use the solutions shown and the principle according to the invention even in the case of fundamentally different embodiments.

LIST OF REFERENCE SIGNS

120 optical component
121 body portion
122 optical active portion
130 aperture (region)
140 protection structure
200 component carrier
210 stack/core
250 encapsulation material
260 connection structure
262 via
RF resin free region
300 component carrier
361 via connection structure
362 (extended) via
370 optically transparent medium (locally applied)
380 buildup layer structure
400 component carrier
470 optically transparent medium (entirely applied)
500 component carrier
520 optical component
561 via connection structure
562 (extended) via
600 component carrier
630 cavity

The invention claimed is:

1. A component carrier, comprising:

a stack comprising at least one electrically conductive layer structure and at least one electrically insulating layer structure;

an optical component embedded within the stack; wherein the optical component comprises an optically active portion;

an opening formed within the stack, wherein the optical component and the opening are spatially arranged and configured such that an optical communication between the optically active portion and an exterior of the stack is enabled;

a protection structure extending around the optically active portion and/or the opening, wherein the protection structure is configured for protecting the optically active portion from a resin flow during an embedding of the optical component in the stack, wherein the protection structure defines a resin free region such that the optically active portion is within the resin free region;

wherein the protection structure is a protrusion protruding from an outer surface of the stack; and an encapsulating material provided in a single electrically insulating layer of the stack at one side of the stack and being in contact with the optical component at a side opposite to the optically active portion, wherein the encapsulating material comprises a resin material completely encapsulating the optical component within the stack up to the protection structure;

wherein the opening is an aperture formed by at least one electrically conductive layer structure and/or at least one electrically insulating layer structure of the stack;

wherein the aperture is at least partially filled with an optically transparent medium.

2. The component carrier as set forth in claim 1, wherein the optical component is embedded within an interior of the stack.

3. The component carrier as set forth in claim 1, wherein the optically transparent medium is formed exclusively within the aperture and optionally within an annular surrounding thereof.

4. The component carrier as set forth in claim 1, wherein the protection structure extends to the full extent around the optically active portion and/or the opening.

5. The component carrier as set forth in claim 4, wherein the protection structure extends circumferentially around the optically active portion and/or the opening; or the protection structure extends in a rectangular manner around the optically active portion and/or the opening.

6. The component carrier as set forth in claim 1, wherein the protection structure is a part of or is directly attached to the optical component.

7. The component carrier as set forth in claim 1, wherein the protection structure protrudes from an outer main surface of the optical component.

8. The component carrier as set forth in claim 1, wherein the optical component comprises a redistribution layer structure, wherein the protection structure forms a part of the redistribution layer structure.

9. The component carrier as set forth in claim 1, wherein the component carrier comprises at least one of the following features:

the protection structure is made of metal and/or an electrically insulating material;

the protection structure comprises a thickness being the same or being larger than a thickness of a layer of the encapsulating material at least partially encapsulating the embedded optical component.

10. The component carrier as set forth in claim 1, wherein the component carrier comprises at least one of the following features:

a transmittance value of the optically transparent medium is larger than 80%;

wherein the transmittance value applies for a wavelength range between 250 nm and 1250 nm;

the optically transparent medium is formed exclusively within the aperture;

the optically transparent medium is formed at an entire main surface of the stack.

11. The component carrier as set forth in claim 1,
wherein the optical component is embedded in a core, wherein a buildup comprising a resin layer is formed on the core.

12. The component carrier as set forth in claim 1,
wherein the optical component is one of:
an optical receiver;
an optical transmitter; and
an optical transceiver.

13. A component carrier, comprising:
a stack comprising at least one electrically conductive layer structure and at least one electrically insulating layer structure;
an optical component embedded within the stack; wherein the optical component comprises an optically active portion;
an opening formed within the stack, wherein the optical component and the opening are spatially arranged and configured such that an optical communication between the optically active portion and an exterior of the stack is enabled;
a protection structure extending around the optically active portion and/or the opening,
wherein the protection structure is configured for protecting the optically active portion from a resin flow during an embedding of the optical component in the stack,
wherein the protection structure defines a resin free region such that the optically active portion is within the resin free region;
wherein the protection structure protrudes from an outer main surface of the optical component by a first protrusion length and sidewalls of the opening protrude from the outer main surface of the optical component by a second protrusion length, wherein the first protrusion length is greater than the second protrusion length; and
an encapsulating material provided in a single electrically insulating layer of the stack at one side of the stack and being in contact with the optical component at a side opposite to the optically active portion, wherein the encapsulating material comprises a resin material completely encapsulating the optical component within the stack up to the protection structure;
wherein the opening is an aperture formed by at least one electrically conductive layer structure and/or at least one electrically insulating layer structure of the stack;
wherein the aperture is at least partially filled with an optically transparent medium.

14. The component carrier of claim 13,
wherein the optical component is embedded within an interior of the stack.

15. The component carrier of claim 13,
wherein the optically transparent medium is formed exclusively within the aperture and optionally within an annular surrounding thereof.

16. The component carrier of claim 13,
wherein the protection structure extends to the full extent around the optically active portion and/or the opening.

17. The component carrier of claim 16,
wherein the protection structure extends circumferentially around the optically active portion and/or the opening; or
the protection structure extends in a rectangular manner around the optically active portion and/or the opening.

18. The component carrier of claim 13,
wherein the protection structure is a part of or is directly attached to the optical component.

19. The component carrier of claim 13,
wherein the protection structure protrudes from an outer main surface of the optical component.

20. The component carrier of claim 13,
wherein the protection structure comprises a thickness that is the same as or greater than a thickness of a layer of the encapsulating material at least partially encapsulating the embedded optical component; and
wherein the optical component comprises a redistribution layer structure, wherein the protection structure forms part of the redistribution layer structure and represents a highest point of the redistribution layer structure above the outer main surface of the optical component.

* * * * *